(12) United States Patent
Pettersen

(10) Patent No.: US 6,566,923 B1
(45) Date of Patent: May 20, 2003

(54) PHASE-FREQUENCY DETECTOR AND CHARGE PUMP WITH FEEDBACK

(75) Inventor: Fred-Johan Pettersen, Oslo (NO)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/981,079

(22) Filed: Oct. 16, 2001

(51) Int. Cl.[7] .................................................. H03L 7/06
(52) U.S. Cl. ........................... 327/157; 327/536; 327/3; 327/7; 327/12; 331/25; 363/59; 363/60
(58) Field of Search .............................. 327/2, 3, 5, 7, 327/10, 12, 157, 390, 534, 536, 589, 590; 331/1 A, 17, 25; 363/59, 60

(56) References Cited

U.S. PATENT DOCUMENTS

| | | | | |
|---|---|---|---|---|
| 5,059,833 A | * | 10/1991 | Fujii | ........................ 331/1 A |
| 5,136,253 A | * | 8/1992 | Ueno | ........................ 328/133 |
| 5,459,765 A | * | 10/1995 | Meyer et al. | ................ 375/360 |
| 5,886,551 A | * | 3/1999 | Narahara | ..................... 327/157 |

* cited by examiner

Primary Examiner—Timothy P. Callahan
Assistant Examiner—An T. Luu
(74) Attorney, Agent, or Firm—Christopher P. Maiorana, P.C.; John J. Ignatowski

(57) ABSTRACT

An apparatus comprising a first circuit and a second circuit. The first circuit may be configured to present (i) a pump up signal in response to a reference signal and a reset signal and (ii) a pump down signal in response to an input signal and the reset signal. The second circuit may be configured to (i) switch a pull up signal in response to the pump up signal, (ii) switch a pull down signal in response to the pump down signal, and (iii) present the reset signal in response to switching the pull up signal and the pull down signal.

18 Claims, 8 Drawing Sheets

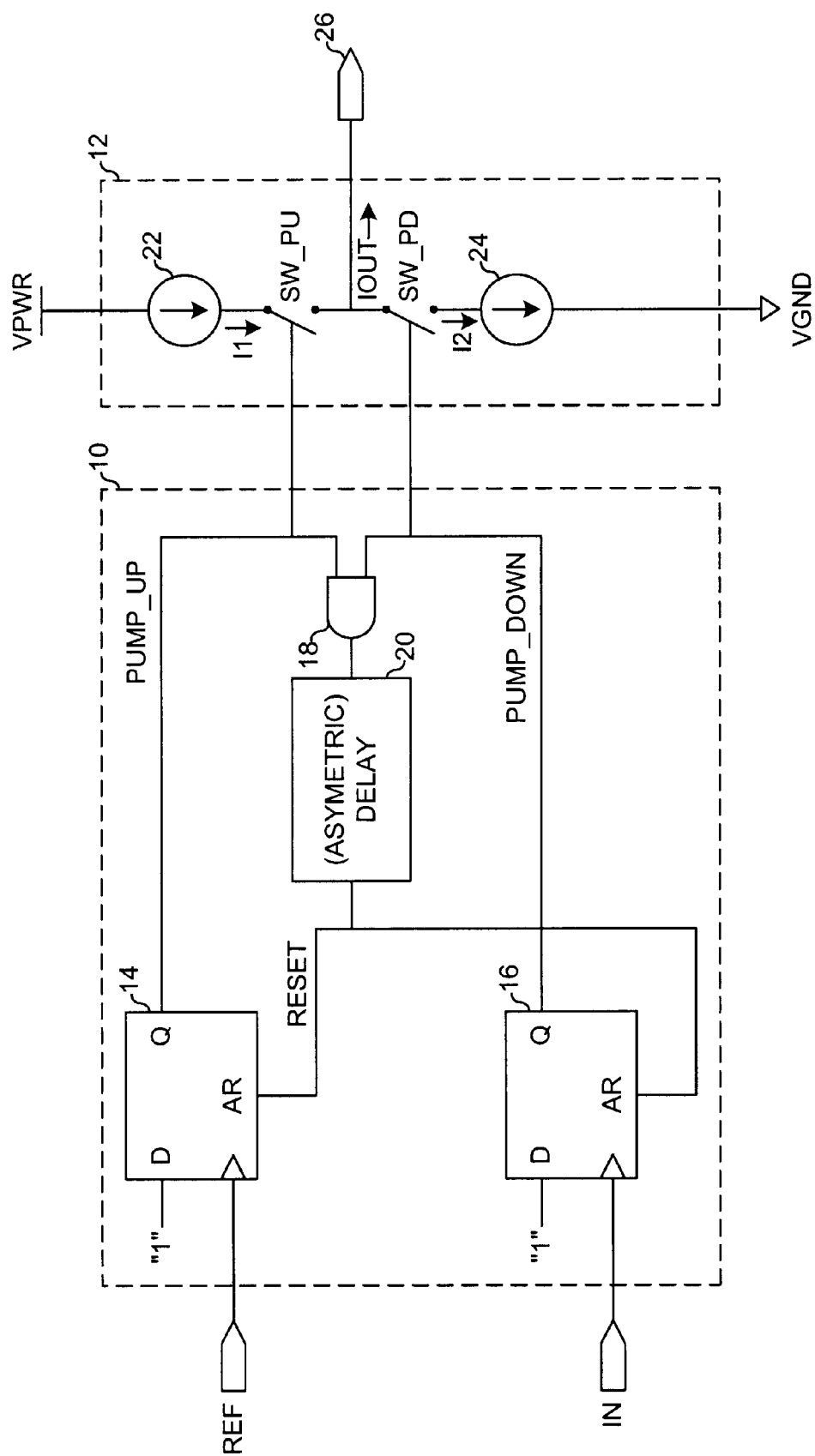
FIG. 1
(CONVENTIONAL)

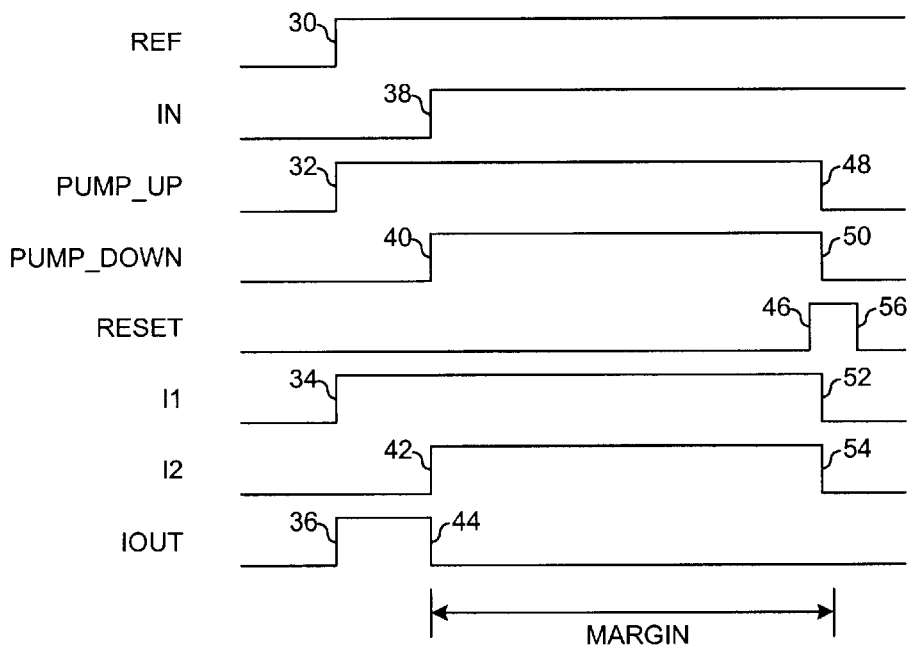
FIG. 2
(CONVENTIONAL)

PHASE-FREQUENCY DETECTOR AND CHARGE PUMP WITH FEEDBACK

FIELD OF THE INVENTION

The present invention relates to a method and/or architecture for phase lock loops generally and, more particularly, to phase-frequency detection and charge pumping with feedback.

BACKGROUND OF THE INVENTION

Referring to FIG. 1, a phase-frequency detector 10 and a charge pump 12 for a conventional phase lock loop are shown. The phase-frequency detector 10 comprises two flip-flops 14 and 16, a logic gate 18, and a delay circuit 20. The charge pump 12 comprises a current, source 22, a current source 24, a switch, SW_PU, and a switch SW_PD. The charge pump 12 may have an interface 26 to present an output signal (i.e., IOUT).

The flip-flop 14 presents a signal (i.e., PUMP_UP) in response to a rising edge of a reference signal (i.e., REF). The other flip-flop 16 presents a signal (i.e., PUMP_DOWN) in response to an input signal (i.e., IN). The logic gate 18 performs a logical AND function on the signal PUMP_UP and the signal PUMP_DOWN to present a reset signal (i.e., RESET). The delay line 20 delays the signal RESET back to the flip-flops 14 and 16. The signal PUMP_UP is also presented to the switch SW_PU in the charge pump 12. The signal PUMP_DOWN is presented to the switch SW_PD in the charge pump 12. While the signal PUMP_UP is in an active state, the switch SW_PU closes causing a current signal (i.e., I1) to flow from the current source 22 to the signal IOUT. While the signal PUMP_DOWN is in active state, the switch SW_PD closes causing a current signal (i.e., I2) to flow from the current source 24 to the signal IOUT.

Referring to FIG. 2, a timing diagram of the signals shown in FIG. 1 is provided. The timing diagram shows a scenario where the signal REF transitions low to high before the signal IN. In a scenario where the signal IN transitions low to high before the signal REF then the signal PUMP_DOWN will become active before the signal PUMP_UP thus causing the signal IOUT to have a negative value.

A rising edge 30 in the signal REF will cause a transition 32 in the signal PUMP_UP from an inactive state to an active state. The signal PUMP_UP transition 32 to the active state causes a transition 34 in the signal I1 from a non-flowing state to a flowing state. The signal I1 is added to the signal IOUT causing a transition 36 in the signal IOUT to a positive non-zero value.

A rising edge 38 in the signal IN causes a transition 40 in the signal PUMP_DOWN from the inactive state to the active state. The signal PUMP_DOWN transition 40 results in a transition 42 in the signal I2 from the non-flowing state to the flowing state. The signal I2 is added to the signal IOUT causing a transition 44 in the signal IOUT back to a zero value. The signal I1 and the signal I2 are conventionally designed to be identically opposite currents. As a result, while both the signal I1 and signal I2 are flowing, the signal IOUT has the zero value.

The combination of the signal PUMP_UP and the signal PUMP_DOWN in the active state may cause the signal RESET to become active at an output of the logic gate 18. The delay circuit 20 will delay the signal RESET for a delay period (e.g., MARGIN). At the end of the delay period MARGIN, a transition 46 takes place in the signal RESET from the inactive state to the active state. The signal RESET transition 46 causes a transition 48 in the signal PUMP_UP and a transition 50 in the signal PUMP_DOWN to the inactive state. The signal PUMP_UP in the inactive state causes a transition 52 in the signal I1 to the non-flowing state. The signal PUMP_DOWN in the inactive state causes a transition 54 in the signal I2 to the non-flowing state. The signal PUMP_UP and/or the signal PUMP_DOWN in the inactive state causes a transition 56 in the signal RESET to the inactive state.

A duration of the signal PUMP_UP minus a duration of the signal PUMP_DOWN equals a difference in arrival times of edges in the signal REF and the signal IN. The difference in arrival times determines a duration of the signal IOUT at the non-zero value. The delay period MARGIN determines an overlap between the signal I1 and the signal I2.

The purpose of the delay circuit 20 or the delay period MARGIN is to make sure that small phase differences between the signal REF and the signal IN cause the signal I1 and/or signal I2 to be switched in the charge pump 12. If the phase difference between the signal REF and the signal IN is at or near zero, then the switch SW_PU and the switch SW_PD will close approximately simultaneously. Once both the switch SW_PU and the switch SW_PD are closed, the current presented by the upper current source 22 is sinked by the lower current source 24. Current source 24 sinking the current source 22 establishes the signal IOUT with the zero value.

Without the delay circuit 20 in the phase-frequency detector 10, a risk is incurred that the signal PUMP_UP and the signal PUMP_DOWN can be too small to cause the switch SW_PU and/or the switch SW_PD to close. Consequently, the phase-frequency detector 10 and the charge pump 12 would not react on very small phase differences between the signal REF and the signal IN.

A problem with the conventional technology is that in order to ensure an overlap in the signal I1 and the signal I2 in all situations, the delay circuit 20 must delay the signal RESET for a worst-case situation. The worst-case situation is commonly influenced by process variations, temperature variations, and power supply voltage variations. The worst-case delay may cause several drawbacks. For example, a crowbar current will flow through the charge pump 12 during the delay period MARGIN. Since the delay period MARGIN is longer than required in most situations, an excessive amount of power is consumed.

Another undesirable situation occurs when the signal I1 and the signal I2 are not evenly matched. When the signal I1 and the signal I2 are not matched, the signal IOUT has a non-zero value during the delay period MARGIN. As a result, the charge pump 12 may present the signal IOUT with a small current that will cause a phase offset in the phase lock loop.

A third situation occurs when the delay period MARGIN is too short. A very short delay period MARGIN commonly results in no overlap between the signal I1 and the signal I2. The non-overlap results in a deadband in the response of the phase lock loop. Slight changes to the phase difference between the signal REF and the signal IN will not result in a change to the signal IOUT.

SUMMARY OF THE INVENTION

The present invention concerns an apparatus comprising a first circuit and a second circuit. The first circuit may be configured to present (i) a pump up signal in response to a reference signal and a reset signal and (ii) a pump down signal in response to an input signal and the reset signal. The second circuit may be configured to (i) switch a pull up signal in response to the pump up signal, (ii) switch a pull down signal in response to the pump down signal, and (iii) present the reset signal in response to switching the pull up signal and the pull down signal.

The objects, features and advantages of the present invention include providing phase-frequency detection and charge pumping with feedback that may (i) detect small phase errors, (ii) reduce current consumption, (iii) minimize crowbar currents, (iv) reduce self-induced phase errors, and/or (v) prevent response deadbands.

BRIEF DESCRIPTION OF THE DRAWINGS

These and other objects, features and advantages of the present invention will be apparent from the following detailed description and the appended claims and drawings in which:

FIG. 1 is a block diagram of a conventional phase-frequency detector circuit and charge pump circuit;

FIG. 2 is a timing diagram of the signals shown in FIG. 1;

DETAILED DESCRIPTION OF THE PREFERRED EMBODIMENTS

Figure 3:
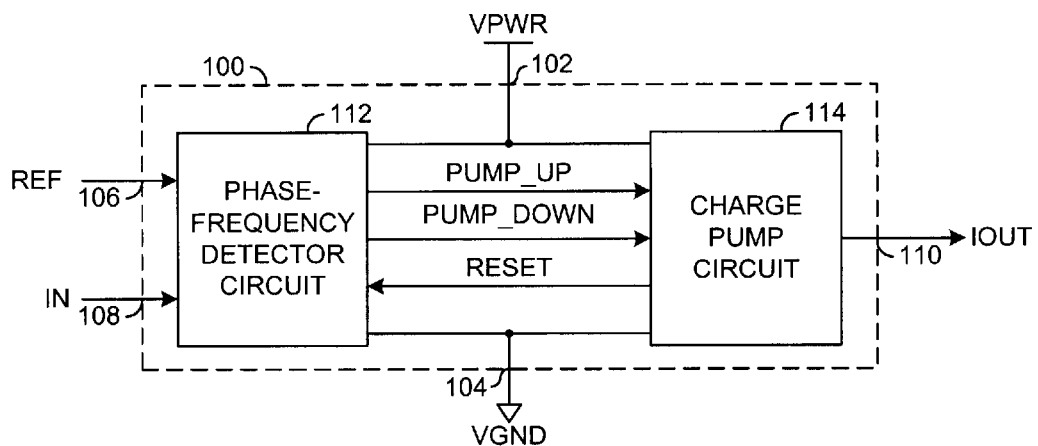
FIG. 3 is a block diagram of an apparatus implementing the present invention.

Referring to FIG. 3, a block diagram of an apparatus 100 is shown in accordance with a preferred embodiment of the present invention. The apparatus 100 may have an interface 102 to connectable to a power source signal (e.g., VPWR). The apparatus 100 may have another interface 104 connectable to a power return signal (e.g., VGND). An interface 106 may be provided in the apparatus 100 to receive a reference signal (e.g., REF). The apparatus 100 may have an input 108 to receive an input signal (e.g., IN). An output 110 may be provided to present an output signal (e.g., IOUT) from the apparatus 100.

The apparatus 100 may be implemented as part of a phase lock loop circuit. The signal REF may be implemented as a voltage signal. The signal REF may be an oscillating signal, such as a square wave, having multiple reference edges and a reference frequency. The signal IN may be implemented as a voltage signal. The amplitude of the signal IN may vary in time to create multiple edges. The signal IOUT may be implemented as a current signal. The signal IOUT may vary between a positive-value and a negative value. The signal IOUT may also have a zero-value where no current is flowing into or out of the output 110.

The apparatus 100 generally comprises a circuit 112 and a circuit 114. The circuit 112 may be implemented as a phase-frequency detector circuit. The circuit 114 may be implemented as a charge pump circuit.

The phase-frequency detector circuit 112 may receive the signal REF. The phase-frequency detector, circuit 112 may receive the signal IN. The charge pump circuit 114 may present the signal IOUT. A signal (e.g., PUMP_UP) may be presented by the, phase-frequency detector circuit 112 to the charge pump circuit 114. Another signal (e.g., PUMP_DOWN) may be presented by the phase-frequency detector circuit 112 to the charge pump circuit 114. A signal (e.g., RESET) may be presented by the charge pump circuit 114 to the phase-frequency detector circuit 112.

The signal PUMP_UP may be generated in response to the signal REF and the signal RESET. The signal PUMP_UP may be implemented as a voltage signal. The signal RESET may be implemented as a voltage signal. While the signal RESET is in an active state, the phase-frequency detection circuit 112 may present the signal PUMP_UP in an inactive or logical zero state.

The signal PUMP_DOWN may be generated in response to the signal IN and the signal RESET. The signal PUMP_DOWN may be implemented as a voltage signal. While the signal RESET is in an active state, the phase-frequency detection circuit 112 may present the signal PUMP_DOWN in the inactive or logical zero state.

Figure 4:
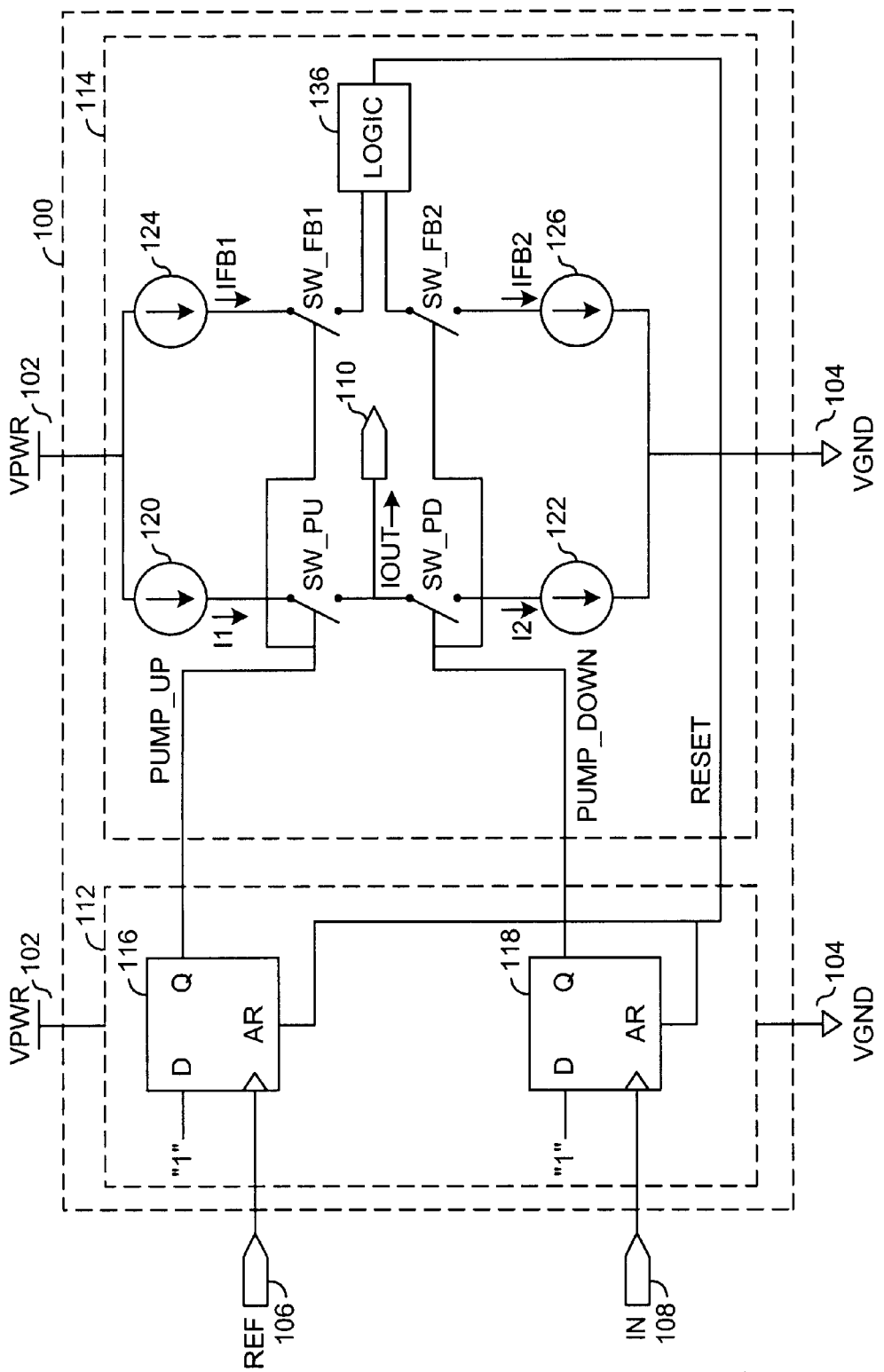
FIG. 4 is a detailed block diagram of the apparatus.

Referring to FIG. 4, a detailed block diagram of the apparatus 100 is shown. The phase-frequency detector circuit 112 generally comprises a flip-flop 116 and a flip-flop 118. The flip-flop 116 and the flip-flop 118 may be implemented as D-type flip-flops. Other types of flip-flops may be implemented in accordance with the design criteria of a particular application.

The flip-flop 116 may have a clock input that receives the signal REF. The flip-flop 116 may have a data input (e.g., D) that may be bias to a logical one state. The flip-flop 116 may have an output (e.g., Q) that may present the signal PUMP_UP. The flip-flop 116 may have a reset input to receive the signal RESET.

The flip-flop 118 may have a clock input to receive the signal IN. The flip-flop 118 may have a data input (e.g., D) that may be biased to the logical one state. The flip-flop 118 may have an output (e.g., Q) to present the signal PUMP_DOWN. The flip-flop 118 may have a reset input to receive the signal RESET.

The charge pump circuit 114 generally comprises a current source 120, a current source 122, a current source 124, a current source 126, a switch SW_PU, a switch SW_PD, a switch SW_FB1, a switch SW_FB2, and a circuit 136. The charge pump circuit 114 may receive the signal VPWR and the signal VGND. The circuit 136 may be implemented as a logic circuit.

The switch SW_PU may be implemented as a pull up switch that may be configured to control a current and/or voltage from the signal VPWR to the output 110. The switch SW_PD may be implemented as a pull down switch that may be configured to control a current and/or voltage from the output 110 to the signal VGND. The switch SW_FB1 may be implemented as a pull up switch that may be configured to control a current and/or voltage from the signal VPWR to the circuit 136. The switch SW_FB2 may be implemented as a pull down switch that may be configured to control a current and/or voltage from the circuit 136 to the signal VGND. The switch SW_PU and the switch SW_FB1 may be controlled simultaneously by the signal PUMP_UP. The switch SW_PD and the switch SW_FB2 may be controlled simultaneously by the signal PUMP_DOWN.

The current source 120 may present a signal (e.g., I1). The signal I1 may be implemented as a pull up current signal.

The current source 120 may be coupled between the interface 102 and a node of the switch SW_PU. The current source 120 may source the signal I1 into the node of the switch SW_PU. Another node of the switch SW_PU may be coupled to the output 110.

The current source 122 may present a signal (e.g., I2). The signal I2 may be implemented as a pull down,current signal. The signal I2 may equal the signal I1 in amplitude. The current source 122 may be coupled between the interface 104 and a node of the switch SW_PD. The current source 122 may sink the signal I2 from the node of the switch SW_PD. Another node of the switch SW_PD may be, coupled to the output 110.

The current source 124 may present a signal (e.g., IFB1). The signal IFB1 may be implemented as a pull up current signal. The signal IFB1 is generally, but not necessarily, a scaled down version of the signal I1 in amplitude. The current source 124 may be coupled between the interface 102 and a node of the switch SW_FB1. The current source 124 may source the signal IFB1 to the node of the switch SW_FB1. Another node of the switch SW_FB1 may be coupled to the circuit 136.

The current source 126 may present a signal (e.g., IFB2). The signal IFB2 may be implemented as a pull down current signal. The signal IFB2 may be a scaled down version of the signal I2 in amplitude. The current source 126 may be coupled between the interface 104 and a node of the switch SW_FB2. The current source 126 may sink the signal IFB2 from the node of the switch SW_FB2. Another node of the switch SW_FB2 may be coupled to the circuit 136.

The circuit 136 may present the signal RESET in response to signal IFB1 and the signal IFB2. The RESET signal may be presented in an inactive state when one or both of the signals IFB1 and IFB2 are in a non-flowing state (e.g., switch SW_FB1 and/or switch SW_FB2 is in an open state). The RESET signal may be presented in an active state when both of the signals IFB1 and IFB2 are in a flowing state (e.g., switch SW_FB1 and switch SW_FB2 are both in a closed state). The signal RESET may be coupled to the reset interface of the flip-flop 116 and the reset interface of the flip-flop 118.

Figure 5:
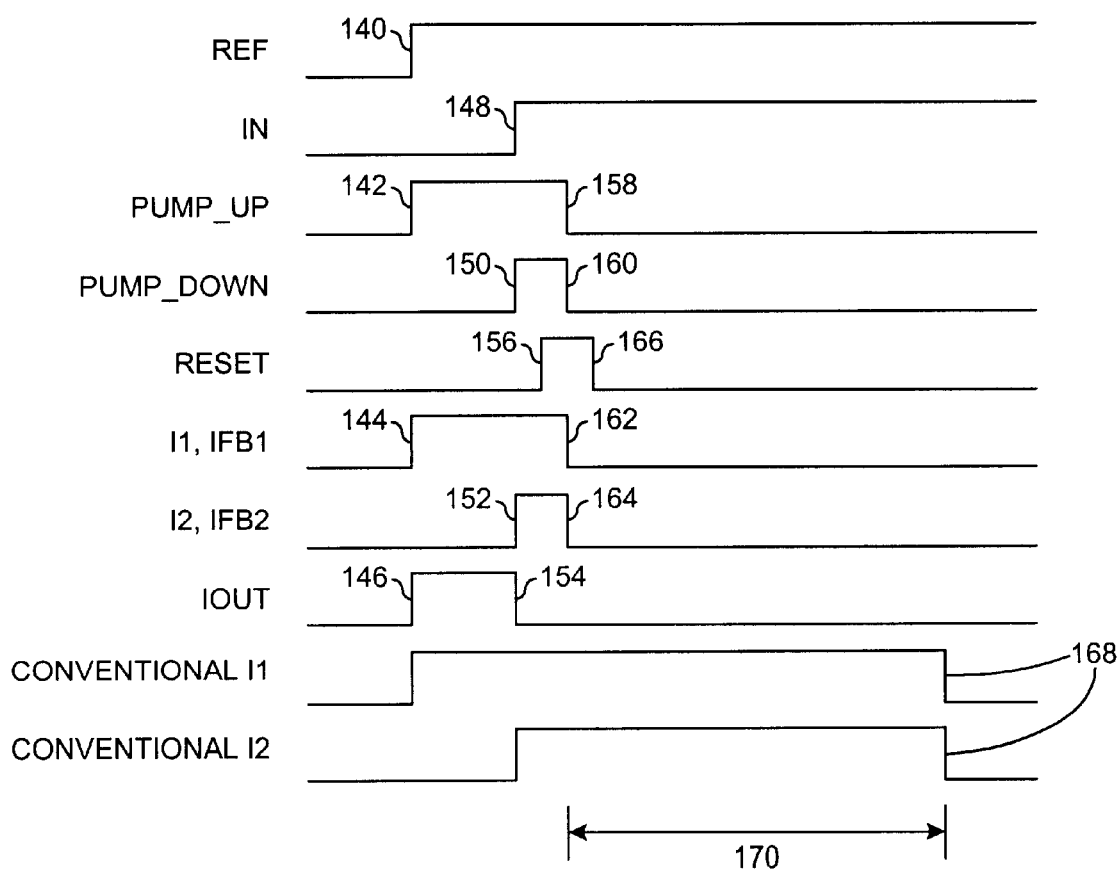
FIG. 5 is a timing diagram of the signals shown in FIG. 4.

Referring to FIG. 5, a timing diagram of the signals shown in FIG. 4 is provided. The timing diagram shows a sample scenario where the signal REF transitions before the signal IN. Other scenarios are possible. For example the signal IN may transition at the same time as or before the signal REF.

The signal REF may have a rising edge 140. The rising edge 140 generally causes the flip-flop 116 to read the logical one state at the data input. Reading the logical one state generally causes a transition 142 in the signal PUMP_UP from the inactive state to the active state. The signal PUMP_UP in the active state may cause the switch SW_PU and the switch SW_FB1 to transition from the open state to the closed state. The switch SW_PU closing may cause a transition 144 in the signal I1 from the non-flowing state to the flowing state. The switch SW_FB1 closing may also cause the transition 144 in the signal IFB1 from the non-flowing state to the flowing state. The signal I1 may be added to the signal IOUT while the SW_FB1 switch 124 is closed (e.g., IOUT=I1). The transition 144 of the signal I1 may cause a transition 146 in the signal IOUT from a zero value to a non-zero positive value.

The signal IN may present a rising edge 148 after the rising edge 140 of the signal REF. The edge 148 of the signal IN generally causes the flip-flop 118 to read the logical one state at the data input. Reading the logical one state may cause a transition 150 in the signal PUMP_DOWN from the inactive state to the active state. The signal PUMP_DOWN in the active state may cause the switch SW_PD and the switch SW_FB2 to transition from the open state to the closed state. The switch SW_PD in the closed state may cause the signal I2 to transition 152 from the non-flowing state to the flowing state. The switch SW_FB2 in the closed state may cause the signal IFB2 to transition 152 from the non-flowing state to the flowing state. The signal I2 may be added to the signal IOUT while the switch SW_FB2 is closed (e.g., IOUT=I1–I2). The signal I2 generally sinks the entire signal I1 resulting in a transition 154 of the signal IOUT back to the zero value.

The circuit 136 may detect the signal IFB1 and the signal IFB2. When the circuit 136 detects the signal IFB1 in the flowing state and the signal IFB2 in the flowing state, the circuit 136 may present a transition 156 in the signal RESET from the inactive state to an active state. The signal RESET in the active state may cause a transition 158 and the signal PUMP_UP from the active state to the inactive state. The signal RESET in the active state may also cause a transition 160 in the signal PUMP_DOWN from the active state to the inactive state.

The signal PUMP_UP and the signal PUMP_DOWN in the inactive state may cause the switch SW_PU, the switch SW_PD, the switch SW_FB1, and the switch SW_FB2 to transition from the closed state to the open state. The switch SW_PU and the switch SW_FB1 opening may cause a transition 162 in the signal I1 and the signal IFB1 from the flowing state to the non-flowing state. The switch SW_PD 130 and the switch SW_FB2 opening may cause a transition 164 in the signal I2 and the signal IFB2 from the flowing state to the non-flowing state. The circuit 136 may detect the signal IFB1 and the signal IFB2 in the non-flowing state. Accordingly, the circuit 136 may present a transition 166 in the signal RESET from the active state to the inactive state.

The present invention may generate the signal RESET differently than the convention method. Instead of generating the signal RESET in the phase-frequency circuit 10 (FIG. 1), the signal RESET may be generated by the circuit 136 within the charge pump circuit 114. The circuit 136 may be designed in such a way as to activate the signal RESET when both the signal I1 and signal I2 have been switched on or to the flowing state. The relatively short delay of the circuit 136 may effectively switch off the signal I1 and signal I2 just after both the signal I1 and signal I2 have been switched on. The result may be (i) a minimum duration crowbar current, (ii) a reduced self-induced phase error caused by a mismatch in the amplitude of the signal I1 with the signal I2, (iii) a guaranteed overlap of the signal I1 and the signal I2 that may eliminate any response deadband of the apparatus 100, (iv) a minimal power consumption, and/or (v) an ability to detect small phase errors.

For comparison, the signal I1 and the signal I2 from the conventional charged pump 12 (FIG. 1) are shown at the bottom of FIG. 5. The conventional signal I1 and signal I2 remain in the flowing state far longer than the signal I1 and signal I2 of the charge pump circuit 114. A difference in time for the signal I1 and signal I2 transitioning to the non-flowing state as compared with a transition 168 in the conventional signal I1 and signal I2 to the non-flowing state is shown as a period 170. Since the signal I1 and signal I2 are not flowing in the charge pump circuit 114 during the period 170, then the charge pump circuit 114 may consume less power than the conventional charge pump circuit 12.

A second scenario may have the signal IN transition 148 occur before the signal REF transition 140. In the second scenario, the transition 146 in the signal IOUT may be from the zero value to a negative non-zero value as determined by the signal I2 (e.g., IOUT=–I2). The transition 154 in the signal IOUT may be back to the zero value when the signal I1 is added to the signal IOUT (e.g., IOUT=I1–I2). The second scenario may be achieved by swapping (i) the signal REF with the signal IN, (ii) the signal PUMP_UP with the signal PUMP_DOWN, (iii) the signal I1 with the signal I2, (iv) the signal IFB1 with the signal IFB2, and (v) inverting the signal IOUT.

A third scenario may have the signal IN transition 148 occur simultaneously with the signal REF transition 140. In the third scenario, the signal PUMP_UP transition 142 and the signal PUMP_DOWN transition 150 may occur generally simultaneously. Likewise, the signal IFB1 transition 144 and the signal IFB2 transition 152 may occur generally simultaneously. Therefore, the signal IOUT (IOUT=I1–I2) may remain at the zero value and not undergo the transitions 146 and 154. The circuit 136 may still present the transition 156 in the signal RESET to the active state after a slight propagation delay. The signal RESET in the active state generally results in the transitions 158, 160, 162 and 164 in the signals PUMP_UP, PUMP_DOWN, I1, IFB1, I2 and IFB2 respectively.

Figure 6:
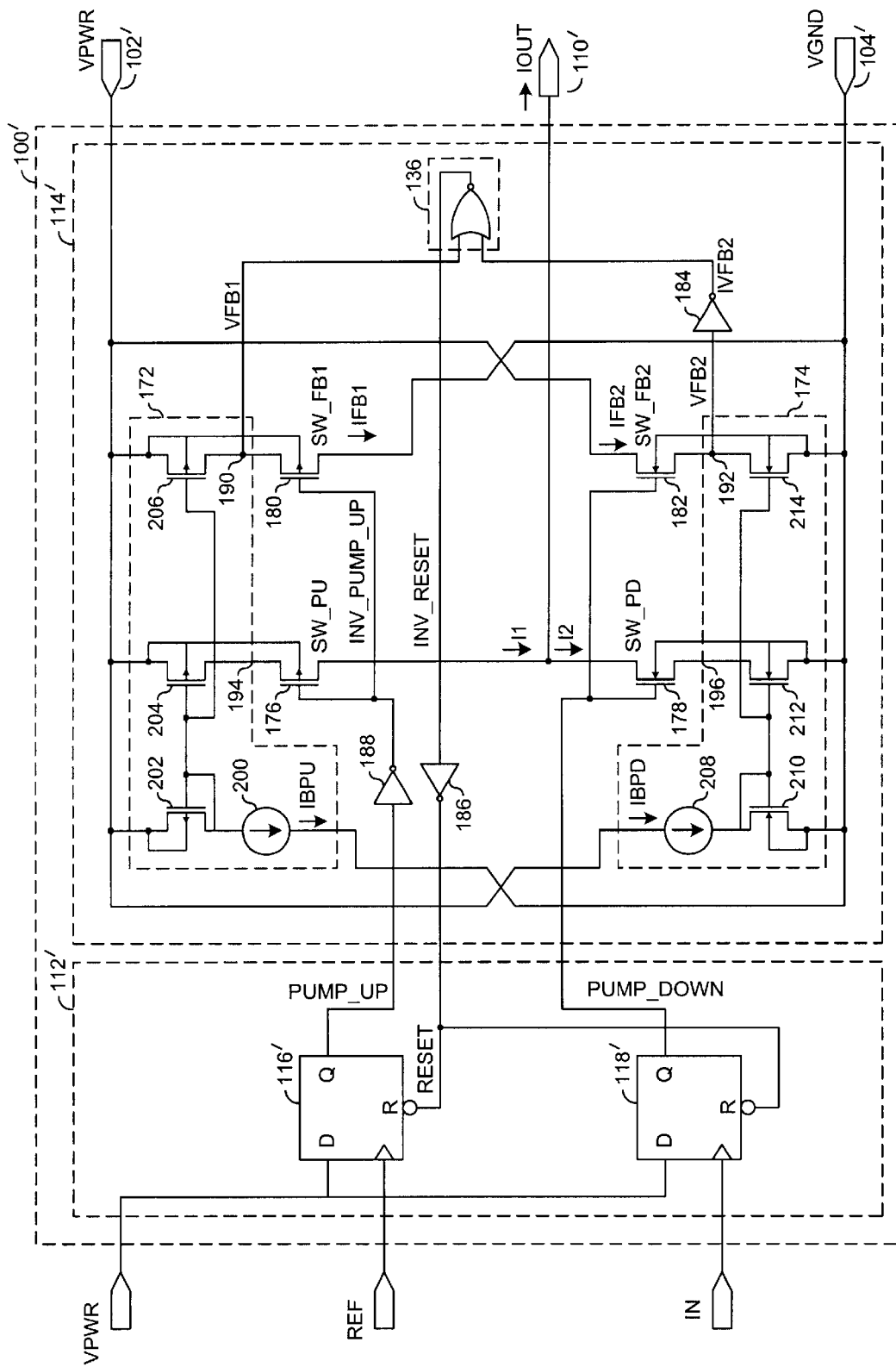
FIG. 6 is a schematic of an embodiment of the present invention.

Referring to FIG. 6, a schematic of an example circuit implementing an apparatus 100' is shown. The apparatus 100' may vary from the apparatus 100 in the polarity of the active state of the signal RESET. The signal RESET may be active in the logical one state for the apparatus 100. The signal RESET may be active in the logical zero state for the apparatus 100'. The apparatus 100' generally comprises a phase-frequency circuit 112' and a charge pump circuit 114'.

The phase-frequency detection circuit 112' may comprise a flip-flop 116' and a flip-flop 118'. The flip-flops 116' and 118' may be implemented as D-type flip-flops. Other types of flip-flops may be implemented to meet the design criteria of a particular application. Other designs of the phase-frequency detection circuit 112' may be implemented to meet the design criteria of a particular application.

The flip-flop 116' may have a clock in put to receive the signal REF and an output (e.g., Q) to present the signal PUMP_UP. The flip-flop 118' may have a clock input to receive the signal IN and an output (e.g., Q) to present the signal PUMP_DOWN. The clock inputs may be triggered on a rising edge. Each of the flip-flops 116' and 118' may have a data input (e.g., R) connectable to the signal VPWR. The flip-flops 116' and 118' may have active low reset inputs (e.g., R).

The charge pump circuit 114' may comprise the circuit 136, a circuit 172, a circuit 174, a transistor 176, a transistor 178, a transistor 180, a transistor 182, an inverter 184, and inverter 186, and an inverter 188. The charge pump circuit 114' may have an interface 102' connectable to the signal VPWR The charge pump circuit 114' may have an interface 104' connectable to the signal VGND. Other designs of the charge pump circuit 114' may be implemented to meet the design criteria of a particular application.

The circuit 136 may be implemented as a logic gate. The logic gate may be configured to perform a logical NOR function. The NOR gate 136 may present a signal. (e.g., INV_RESET). The NOR gate 136 may receive a signal (e.g., VFB1) from a node 190 of the circuit 172. The NOR gate 136 may receive another signal (e.g., IVFB2) from the inverter 184. The inverter 184 may invert a signal (e.g., VFB2) received from a node 192 of the circuit 174 to present the signal IVFB2. The inverter 186 may invert the signal INV_RESET to present the signal RESET to the phase-frequency detector circuit 112'.

The transistors 176, 178, 180, and 182 may operate as switches. In particular, the transistor 176 may operate as the switch SW_PU to switch the signal I1 from a node 194 of the circuit 172 to the output 110'. The transistor 178 may operate as the switch SW_PD to switch the signal I2 from a node 196 of the circuit 174. The transistor 180 may operate as the switch SW_FB1 to switch the signal IFB1 from the node 190 to the interface 104' for the signal VGND. The transistor 180 may operate as the switch SW_FB2 the signal IFB2 from the node 192 to the interface 102' for the signal VPWR.

The switch SW_FB1 may control the signal VFB1. The signal VFB1 may be implemented as a voltage signal. The signal VFB1 may be in the logical one state while the switch SW_FB1 in the open state. The signal VFB1 may be in the logical zero state while the switch SW_FB1 in the closed state.

The switch SW_FB2 may control the signal VFB2. The signal VFB2 may be implemented as a voltage signal. The signal VFB2 may be in the logical zero state while the switch SW_FB2 in the open state. The signal VFB2 may be in the logical one state while the switch SW_FB2 in the closed state.

The circuit 172 may be implemented as a pull up circuit. The pull up circuit 172 generally comprises a current source 200, a transistor 202, a transistor 204, and a transistor 206. The current source 200 may drive a current signal (e.g., IBPU) through the transistor 202. The transistor 202 and the transistor 204 may be configured to form a current mirror. Therefore, the transistor 204 may present the signal I1 at the node 194 to mirror the signal IBPU of the current source 200. The transistor 202 and the transistor 206 may be configured to form another current mirror. The transistor 206 may present the signal IFB1 at the node 190 to mirror the signal IBPU of the current source 200. Other implementations of the pull up circuit 172 may be provided to meet the design criteria of a particular application.

The circuit 174 may be implemented as a pull down circuit. The pull down circuit 174 generally comprises a current source 208, a transistor 210, a transistor 212, and a transistor 214. The current source 208 may drive a current signal (e.g., IBPD) through the transistor 210. The transistor 210 and the transistor 212 may be configured to form a current mirror. Therefore, the transistor 212 may present the signal I2 at the node 196 to mirror the signal IBPD of the current source 208. The transistor 210 and the transistor 214 may be configured to form another current mirror. The transistor 214 may present the signal IFB2 at the node 192 to mirror the signal IBPD of the current source 206. The signal IBPU generally is implemented to match the signal IBPD in amplitude. As a result, the signal I1 may match the signal I2 and the signal IFB1 may match the signal IFB2 in amplitude. Other implementations of the pull down circuit 174 may be provided to meet the design criteria of a particular application.

The inverter 184 may invert the signal VFB2 received from the pull down circuit 174 to present the signal IVFB2 to the NOR gate 136. The inverter 186 may invert the signal INV_RESET received from the NOR gate 136 to present the signal RESET to the phase-frequency detector circuit 112'. The inverter 188 may invert the signal PUMP_UP received from the phase-frequency circuit 112' to present a signal (e.g., INV_PUMP_UP) to gates of the transistor 176 and the transistor 180.

Figure 7:
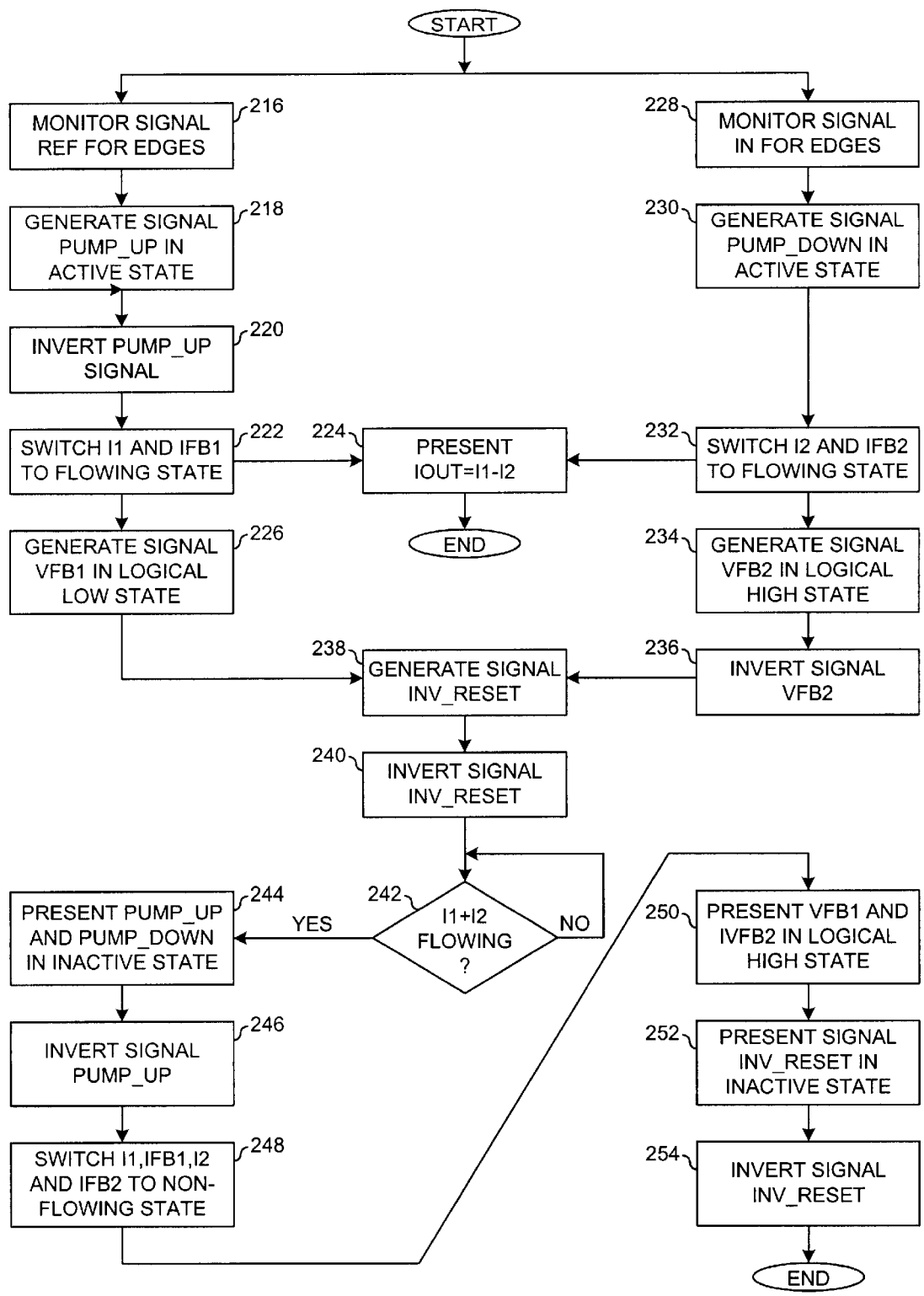
FIG. 7 is a flow diagram of a method of operation.

Referring to FIG. 7, a flow diagram of a method of operating the apparatus 100' is shown. The method may begin with the flip-flop 116' monitoring the signal REF for a next edge (e.g., block 216). When the flip-flop 116' detects an edge in the signal REF, the flip-flop 116' may generate and present the signal PUMP_UP in the active state (e.g., block 218). The inverter 188 may invert the signal PUMP_UP to present the signal INV_PUMP_UP in the active state (e.g., block 220). The transistors 176 and 180 may switch the signals I1 and IFB1 from the non-flowing state to the flowing state in response to receiving the signal INV_PUMP_UP in the active state at respective gate nodes (e.g., block 222). The signal I1 may be added to the signal IOUT (e.g., block 224). The signal IFB1 in the flowing state may be indicative of the signal I1 being in the flowing state. Switching the signal IFB1 to the signal VGND may generate and present the signal VFB1 in the logical low state (e.g., block 226). The signal VFB1 in the logical low state may also be indicative of the signal I1 being in the flowing state.

While the flip-flop 116' is monitoring the signal REF for edges, the flip-flop 118' may be simultaneously monitoring the signal IN for edges (e.g., block 228). When the flip-flop 118' detects an edge in the signal IN, the flip-flop 118' may generate and present the signal PUMP_DOWN in the active state (e.g., block 230). The transistors 178 and 182 may switch the signals I2 and IFB2 from the non-flowing state to the flowing state in response to receiving the signal PUMP_DOWN in the active state at respective gate nodes (e.g., block 232). The signal I2 may be combined with the signal IOUT (e.g., block 224). The signal IFB2 in the flowing state may be indicative of the signal I2 being in the flowing state. Switching the signal IFB2 to the signal VPWR may generate and present the signal VFB2 in the logical high state (e.g., block 234). The inverter 184 may invert the signal VFB2 to present the signal IFB2 (e.g., block 236). The signal IVBF2 in the logical low state may also be indicative of the signal I2 being in the flowing state.

The NOR gate 136 may generate and present the signal INV_RESET based upon the signal VFB1 and the signal VFB2 (e.g., block 238). The inverter 186 may invert the signal INV_RESET to generate and present the signal RESET (e.g., block 240). The signal RESET may be presented to the flip-flop 116' and the flip-flop 118'.

While one or both of the signals I1 and I2 are in the non-flowing state (e.g., the NO branch of decision block 242), one or both of the signals VFB1 and VFB2 may be in the logical high state. While one or both of the signals VFB1 and VFB2 are in the logical high state, the NOR gate 136 may present the signal INV_RESET in the logical low state. The inverter 186 may therefore present the signal RESET to the flip-flops 116' and 118' in the logical high or inactive state.

While the signal I1 and the signal I2 are both in the flowing state (e.g., the YES branch of the decision block 242), the signal VFB1 and the signal IVFB2 may be in the logical low state. While both the signals VFB1 and IVFB2 are in the logical low state, the NOR gate 136 may present the signal INV_RESET in the logical high state. The inverter 186, in turn, may present the signal RESET in the logical low or active state. The flip-flops 116' and 118' may respond to the active signal RESET by presenting the signal PUMP_UP and the signal PUMP_DOWN in the inactive state (e.g., block 244). Therefore, the inverter 188 may present the signal INV_PUMP_UP in the inactive state (e.g., block 246).

The transition of the signal INV_PUMP_UP and the signal PUMP_DOWN to the inactive state may cause the transistors 176, 178, 180, and 182 to switch to the open state. The transistors 176, 178, 180 and 180 transitioning to the open state may cause the signal I1, the signal IFB1, the signal I2, and the signal IFB2 to transition to the non-flowing state (e.g., block 248). While the signal IFB1 is in the non-flowing state, the signal VFB1 may be presented in the logical high state (e.g., block 250). While the signal IFB2 is in the non-flowing state, the signal VFB2 may be presented in the logical low state. Therefore, the signal IVFB2 may be presented in the logical high state (e.g., block 250). While both the signal VFB1 and the signal IVFB2 are in the logical high state, the NOR gate 136 may present the signal INV_RESET in the logical low state (e.g., block 252). Therefore, the signal RESET may be presented in the logical high or inactive state by the inverter 186 (e.g., block 254). The flip-flops 116' and 118' may respond to the signal RESET in the inactive state by allowing the signal PUMP_UP and the signal PUMP_DOWN to respond again to the signal REF and the signal IN respectively.

The transistors 176, 180, 202, 204, and 206 may be implemented as p-channel MOS transistors. The transistors 178, 182, 210, 212, and 214 may be implemented as n-channel MOS transistors. The p-channel MOS transistors and the n-channel MOS transistor may be products of a standard CMOS logic cell technology. Other technologies may be used to implement the transistors to meet the design criteria of a particular application. Examples of other suitable technologies include, but are not limited to, ECL, TTL, and discrete logic circuits and transistors.

Figure 8:
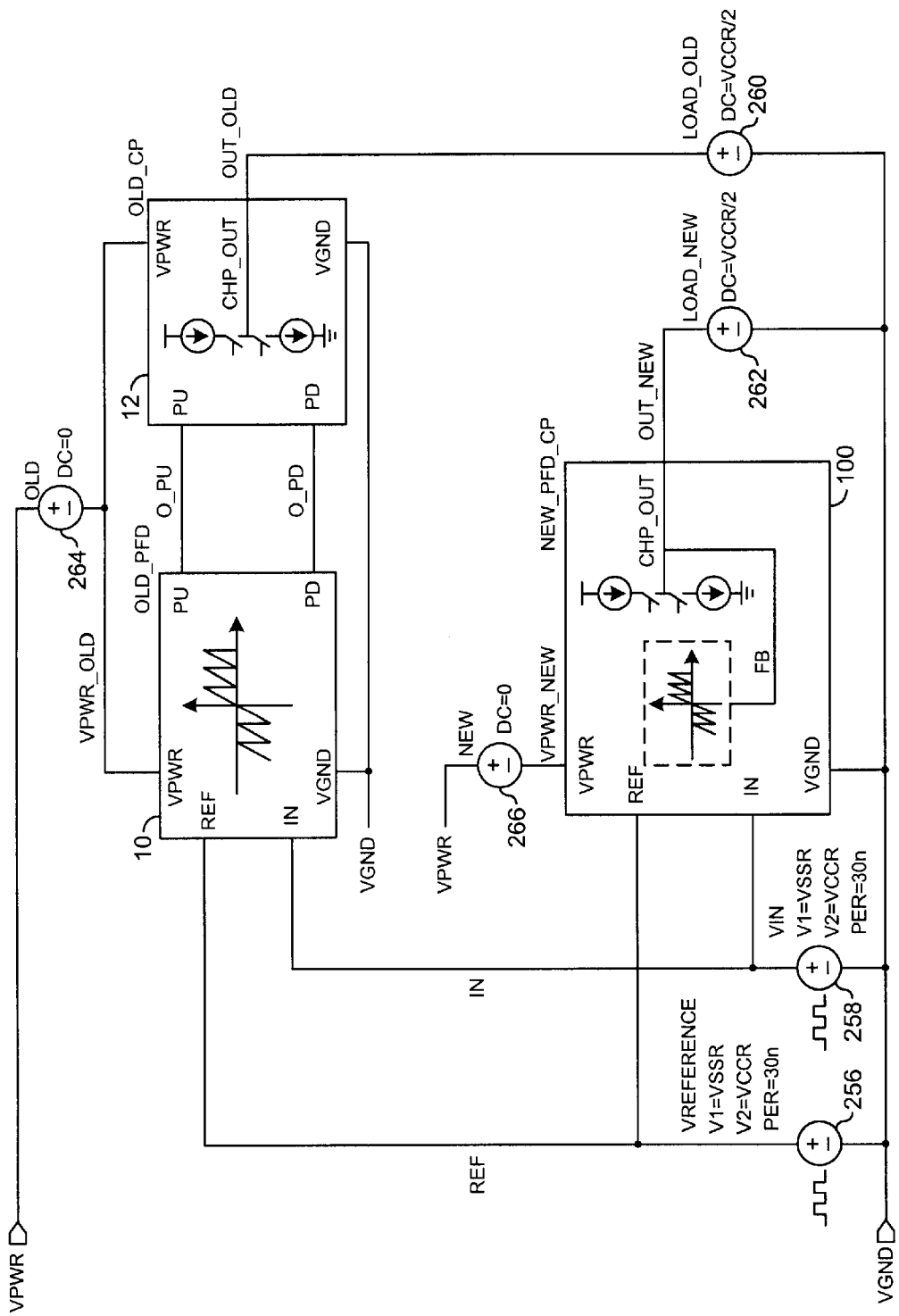
FIG. 8 is a block diagram of a test set up.

Referring to FIG. 8, a block diagram of a test setup is shown. The test setup may comprise the apparatus 100 and the conventional phase-frequency detection circuit 10 coupled to the conventional charge pump circuit 12. The test setup may include a voltage source 256, a voltage source 258, a voltage source 260, a voltage source 262, a voltage source 264, and a voltage source 266.

The voltage source 256 may generate and present the signal REF to both the conventional phase-frequency circuit 10 and the phase-frequency circuit 112 of the apparatus 100. The voltage source 258 may generate and present the signal IN to both the conventional phase-frequency circuit 10 and the phase-frequency circuit 112 of the apparatus 100. The voltage source 260 may generate and present a load voltage (e.g., LOAD_OLD) to the output 26. The voltage source 262 may generate and present another load voltage (e.g., LOAD_NEW) to the output 110. The voltage source 264 may adjust the signal VPWR voltage presented to the conventional phase-frequency detector circuit 10 and the conventional charge pump circuit 12. The voltage source 266 may adjust the signal VPWR voltage presented to the apparatus 100. In one embodiment, the voltage source 264 and the voltage source 266 may adjust the signal VPWR voltage by zero volts.

Figure 9:
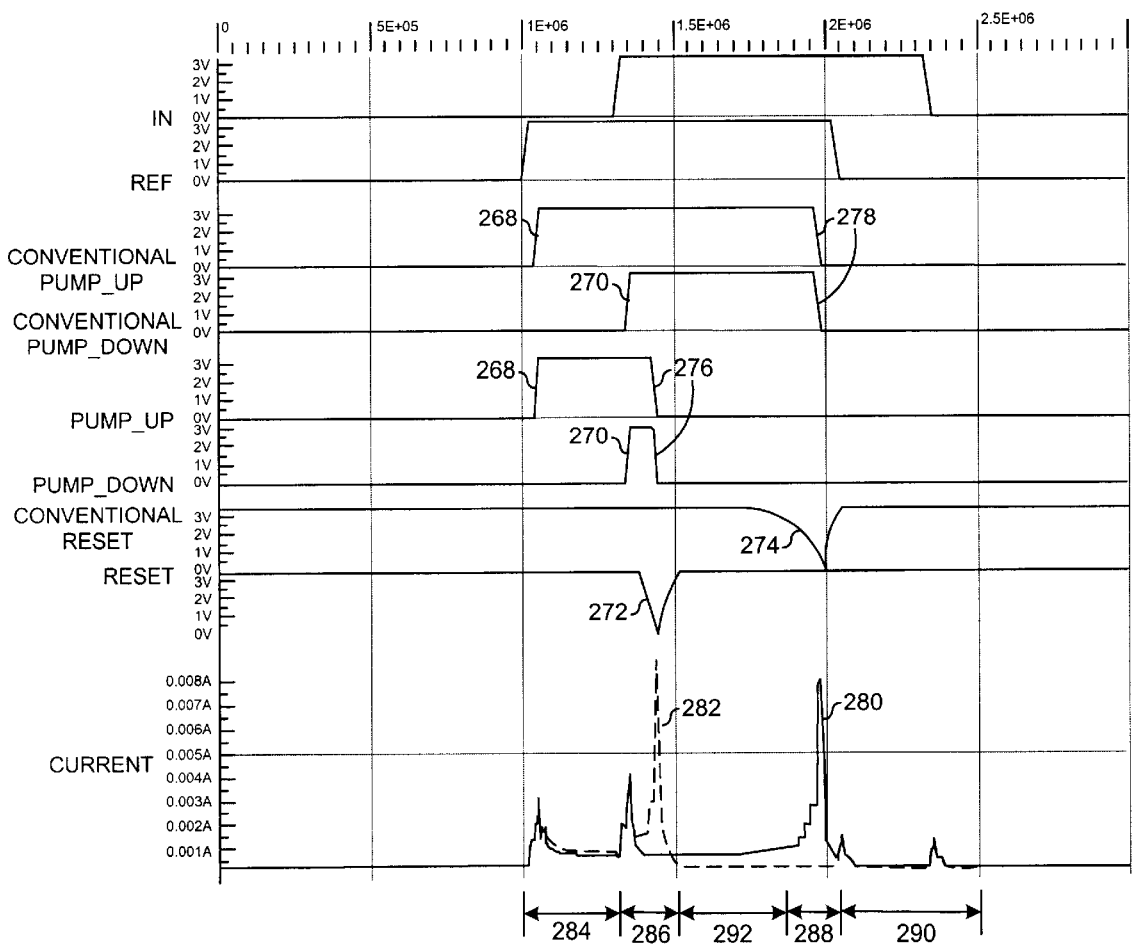
FIG. 9 is a timing diagram of the signals shown in FIG. 8.

Referring to FIG. 9, a timing diagram of the signals of the test setup is shown. Given the same signal REF and signal IN, the conventional signal PUMP_UP and the signal PUMP_UP may have a transition 268 to the active state at the same time. Likewise, the conventional signal PUMP_DOWN and the signal PUMP_DOWN may have a transition 270 to the active state at the same time.

The apparatus 100 may present a transition 272 in the signal RESET to the active state earlier than the conventional phase-frequency detector 10 presents a transition 274 in the conventional signal RESET. As a result, the signal PUMP_UP and the signal PUMP_DOWN may have a transition 276 back to the inactive state much earlier than a transition 278 of the conventional signal PUMP_UP and the conventional signal PUMP_DOWN.

A total amount of current consumed by the conventional phase-frequency circuit 10 and the conventional charge pump circuit 12 as a function of time may be represented by a curve 280. The total amount of current consumed by the apparatus 100 as a function of time may be represented by a curve 282. During a first period 284, both the curve 280 and the curve 282 follow the same basic path since both are performing the same tasks of edge detection in the signal REF and the signal IN. During a second period 286, the apparatus 100 may undergo a peak in consumed current while the signal RESET is transitioning from inactive to active and back to inactive. The conventional curve 280 may undergo a similar peak during a period 288. During a period 290, both the conventional curve 280 and the curve 282 may experience a couple of spikes during trailing edges in the signal REF and the signal IN.

A period 292 may exist in which the conventional curve 280 may be different from the curve 282. During the period 292, the conventional charge pump 12 may crowbar the signal I1 and the signal I2 during the delay period MARGIN. As a result, the conventional curve 280 may show an appreciable current consumption during the period 290. In contrast, the curve 282 may be near zero amperes during the period 290 because the signal RESET has already been cycled and the phase-frequency circuit 112 and the charge pump circuit 114 may have been reset. As a result, the signals I1, IFB1, I2, and IFB2 may be in the non-flowing state during the period 290.

Many variations may be implemented at different levels for the present invention. For example, the logic circuit 136 may be implemented to sense in a current-mode (as in the apparatus 100), a voltage mode (as in the apparatus 100'), and/or a combination of current and voltage modes. The present invention may also be customized at the transistor level to meet the design criteria of a particular application. The signals I1, IFB1, I2, IFB2, VFB1 and/or VFB2 may be used to control signal sources directly such as the current source 120, 122, 124, and 126.

Because the signal RESET may be presented in the active state while the signal I1 and the signal I2 are both in the flowing state, the present invention may be insensitive to many process and operational parameters. For example, the present invention may provide a level of independence to a fabrication process, an operating temperature, and an operating voltage applied to the phase-frequency circuit 112 and/or charge pump circuit 114. As a result, a design time for the apparatus 100 may be minimized because a worst case delay period MARGIN does not have to be calculated for all possible process and operational parameter variations.

Application of the present invention to a phase lock loop may help reduce a phase error of the phase lock loop. Because the signal I1 and the signal I2 are transitioned to the non-flowing state shortly after both are in the flowing state, then any mismatch between the signal I1 amplitude an the signal I2 amplitude may appear as an error component in the signal IOUT for a short duration. In particular, the delay period MARGIN for the apparatus 100 is small as compared with a conventional phase lock loop. Therefore, time available to accumulate the error component, and thus increase the phase error, is small.

The quick transition of the signal RESET through the active state may also result in lower power consumption for the apparatus 100. Since the signal I1 and the signal I2 form a crowbar signal during a short period (e.g., from the transition 270 to the transition 276 in FIG. 8), the total amount of current consumed by the apparatus 100 may be kept low, especially during the period 292.

The apparatus 100 may guarantee that an overlap of the signal I1 and the signal I2 in the flowing state. For example, consider a case where the signal I1 is very slow in transitioning from the non-flowing state to the flowing state. The slow signal I1 may not reach the flowing state until well after the signal I2 reached the flowing state although the signal I1 may have started to transition first. Therefore, the logic circuit 136 may maintain the signal RESET in the inactive state until both of the signal I1 and the signal I2 have overlapped and both are in the flowing state.

The various signals of the present invention are generally "on" (e.g., a digital HIGH, a logical one, or 1) or "off" (e.g., a digital LOW, a logical low, or 0). However, the particular polarities of the on (e.g., asserted or active) and off (e.g., de-asserted or inactive) states of the signals may be adjusted (e.g., reversed) accordingly to meet the design criteria of a particular implementation. Additionally, inverters may be added to change a particular polarity of the signals.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to present (i) a pump up signal in response to a reference signal and a reset signal and (ii) a pump down signal in response to an input signal and said reset signal; and
    a second circuit configured to (i) switch a pull up signal in response to said pump up signal, (ii) switch a pull down signal in response to said pump down signal and (iii) present said reset signal in response to switching said pull up signal and said pull down signal.

2. The apparatus according to claim 1, wherein said second circuit is further configured to (a) switch a second pull up signal in response to said pump up signal, (b) switch a second pull down signal in response to said pump down signal, and (c) present said reset signal in response to switching said second pull up signal and said second pull down signal.

3. The apparatus according to claim 2, wherein said second circuit comprises:
    a pull up current source configured to present said second pull up signal;
    a pull up switch configured to switch said second pull up signal to a first node;
    a pull down current source configured to present said second pull down signal;
    a pull down switch configured to switch said second pull down signal to a second node; and
    a logic circuit configured to present said reset signal in response to switching said second pull up signal to said first node and said second pull down signal to said second node.

4. The apparatus according to claim 2, wherein said second circuit comprises:
    a pull up circuit having a first node to present said second pull up signal;
    a pull up switch configured to switch said first node to a power return in response to said pump up signal;

a pull down circuit having a second node to present said second pull down signal;

a pull down switch configured to switch said second node to a power source in response to said pump down signal; and a logic gate configured to present said reset signal in response to a first signal at said first node and a second signal at said second node.

5. The apparatus according to claim 4, wherein said second circuit further comprises:

a first inverter configured to invert said second signal to present an inverted second signal; and a second inverter configured to invert an inverted reset signal to present said reset signal, wherein said logic gate is a logical NOR gate configured to present said inverted reset signal in response to said first signal and said inverted second signal.

6. The apparatus according to claim 4, wherein said second circuit further comprises:

an output;

a second pull up switch configured to switch said pull up signal between said pull up circuit and said output in response to said pump up signal; and a second pull down switch configured to switch said pull down signal between said pull down circuit and said output in response to said pump down signal.

7. The apparatus according to claim 6, wherein said pull up circuit comprises:

a first current source;

a first current source mirror coupled to said first current source and configured to present said pull up signal; and a second current source mirror coupled to said first current source and configured to present said second pull up signal.

8. The apparatus according to claim 7, wherein said pull down circuit comprises:

a second current source;

a third current source mirror coupled to said second current source and configured to present said pull down signal; and a fourth current source mirror coupled to said second current source and configured to present said second pull down signal.

9. The circuit according to claim 1, wherein said first circuit is a phase-frequency detector circuit and said second circuit is a charge pump circuit.

10. A method of phase-frequency detection and charge pumping comprising the steps of:

(A) generating a pump up signal in response to a reference signal and a reset signal;

(B) generating a pump down signal in response to an input signal and said reset signal;

(C) switching a pull up signal in response to said pump up signal;

(D) switching a pull down signal in response to said pump down signal; and (E) generating said reset signal in response to switching said pull up signal and said pull down signal.

11. The method according to claim 10, further comprising the steps of:

switching a second pull up signal in response to said pump up signal; and switching a second pull down signal in response to said pump down signal, wherein generating said reset signal is in response to switching said second pull up signal and said second pull down signal.

12. The method according to claim 11, further comprising the steps of:

generating said second pull up signal prior to switching said second pull up signal; and generating said second pull down signal prior to switching said second pull down signal.

13. The method according to claim 11, wherein:

switching said second pull up signal further comprises the sub-step of switching said second pull up signal between a first node and a power return to generate a first signal;

switching said second pull down signal further comprises the sub-step of switching said second pull down signal between a second node and a power source to generate a second signal; and generating said reset signal is in response to said first signal and said second signal.

14. The method according to claim 13, further comprising the steps of:

inverting said second signal to generate an inverted second signal;

logically NORing said first signal and said inverted second signal to present an inverted reset signal; and inverting said inverted reset signal to present said reset signal.

15. The method according to claim 13, wherein:

switching said pull up signal further comprises the sub-step of switching said pull up signal to an output in response to said pump up signal; and switching said pull down signal further comprises the sub-step of switching said pull down signal to said output in response to said pump down signal.

16. The method according to claim 15, further comprising the steps of:

generating a first constant current;

mirroring said first constant current to generate said pull up signal; and mirroring said first constant current to generate said second pull up signal.

17. The method according to claim 16, further comprising the steps of:

generating a second constant current;

mirroring said second constant current to generate said pull down signal; and mirroring said second constant current to generate said second pull down signal.

18. An apparatus comprising:

means for generating a pump up signal in response to a reference signal and a reset signal;

means for generating a pump down signal in response to an input signal and said reset signal;

means for switching a pull up signal in response to said pump up signal;

means for switching a pull down signal in response to said pump down signal; and means for generating said reset signal in response to switching said pull up signal and said pull down signal.

* * * * *